(12) United States Patent
Suzuki et al.

(10) Patent No.: US 10,818,990 B2
(45) Date of Patent: Oct. 27, 2020

(54) MAGNETORESISTANCE EFFECT DEVICE AND MAGNETORESISTANCE EFFECT MODULE

(71) Applicant: TDK CORPORATION, Tokyo (JP)

(72) Inventors: Tsuyoshi Suzuki, Tokyo (JP); Shinji Hara, Tokyo (JP)

(73) Assignee: TDK CORPORATION, Tokyo (JP)

( * ) Notice: Subject to any disclaimer, the term of this patent is extended or adjusted under 35 U.S.C. 154(b) by 45 days.

(21) Appl. No.: 16/262,354

(22) Filed: Jan. 30, 2019

(65) Prior Publication Data

US 2019/0237662 A1 Aug. 1, 2019

(30) Foreign Application Priority Data

Feb. 1, 2018 (JP) .................................. 2018-016684
Dec. 11, 2018 (JP) .................................. 2018-231754

(51) Int. Cl.
*H01P 1/218* (2006.01)
*H01L 43/08* (2006.01)
(Continued)

(52) U.S. Cl.
CPC .............. *H01P 1/218* (2013.01); *H01L 27/22* (2013.01); *H01L 43/02* (2013.01); *H01L 43/08* (2013.01);
(Continued)

(58) Field of Classification Search
CPC ........... H01P 1/218; G11B 5/39; H01L 43/08; H03B 15/00
(Continued)

(56) References Cited

U.S. PATENT DOCUMENTS

2009/0140733 A1* 6/2009 Koga .................... G01R 33/093
324/252
2014/0056060 A1 2/2014 Khvalkovskiy et al.
(Continued)

FOREIGN PATENT DOCUMENTS

| JP | 2017-063397 A | 3/2017 |
| WO | 2007/032149 A1 | 3/2007 |
| WO | 2018/052062 A1 | 3/2018 |

OTHER PUBLICATIONS

Konishi, K. et al., "Radio-frequency amplification property of the MgO-based magnetic tunnel junction using field-induced ferromagnetic resonance". Applied Physics Letters, vol. 102, pp. 162409-1-162409-4, 2013.

*Primary Examiner* — Benny T Lee
*Assistant Examiner* — Hafizur Rahman
(74) *Attorney, Agent, or Firm* — Oliff PLC

(57) ABSTRACT

A magnetoresistance effect device includes a first port, a second port, a first circuit unit and a second circuit unit which are connected in series between the first port and the second port, a shared reference electric potential terminal or a first reference electric potential terminal and a second reference electric potential terminal, and a shared DC application terminal or a first DC application terminal and a second DC application terminal, wherein the first circuit unit and the second circuit unit include a magnetoresistance effect element and a conductor connected to one end thereof, a first end portion of the conductor is connected to a high-frequency current input side, and a second end portion of the first conductor is connected to the shared reference electric potential terminal, the first reference electric potential terminal or the second reference electric potential terminal.

8 Claims, 5 Drawing Sheets

(51) Int. Cl.
  *H03B 15/00*   (2006.01)
  *H03H 1/00*   (2006.01)
  *H01L 27/22*   (2006.01)
  *H01L 43/02*   (2006.01)
  *H03H 2/00*   (2006.01)

(52) U.S. Cl.
  CPC ......... *H03B 15/006* (2013.01); *H03H 1/0007* (2013.01); *H03H 2/00* (2013.01); *H03H 2001/0057* (2013.01); *H03H 2001/0085* (2013.01)

(58) Field of Classification Search
  USPC ....................................................... 333/175
  See application file for complete search history.

(56) References Cited

U.S. PATENT DOCUMENTS

| | | | |
|---|---|---|---|
| 2015/0214953 A1* | 7/2015 | Lee | H01L 21/822 327/510 |
| 2016/0277000 A1 | 9/2016 | Shibata et al. | |
| 2017/0244377 A1 | 8/2017 | Yamane et al. | |

\* cited by examiner

MAGNETORESISTANCE EFFECT DEVICE AND MAGNETORESISTANCE EFFECT MODULE

CROSS-REFERENCE TO RELATED APPLICATION

Priority is claimed on Japanese Patent Application No. 2018-016684 filed in Japan on Feb. 1, 2018 and Japanese Patent Application No. 2018-231754 filed in Japan on Dec. 11, 2018, the contents of which are incorporated herein by reference.

BACKGROUND

The present disclosure relates to a magnetoresistance effect device and a magnetoresistance effect module.

In recent years, high-speed wireless communication has advanced as mobile communication terminals such as cellular phones have become more sophisticated. Since a communication speed is proportional to a bandwidth of a frequency in use, a frequency band necessary for communication has increased. Accordingly, the number of high-frequency filters necessary for a mobile communication terminal has also increased.

Recently, spintronics has been studied as a field that may be applied to new high frequency parts. One of the phenomena gaining attention regarding this is a ferromagnetic resonance phenomenon of a magnetoresistance effect element.

When an AC current or AC magnetic field is applied to a ferromagnetic layer included in a magnetoresistance effect element, ferromagnetic resonance can be caused in the magnetization of the ferromagnetic layer. When ferromagnetic resonance is caused, a resistance value of the magnetoresistance effect element periodically oscillates at a ferromagnetic resonance frequency. The ferromagnetic resonance frequency changes according to the intensity of the magnetic field applied to the ferromagnetic layer and the ferromagnetic resonance frequency thereof is generally a high frequency band of several to several tens of GHz.

For example, Japanese Unexamined Patent Application, First Publication No. 2017-063397 describes a magnetoresistance effect device which can be used as a high-frequency device such as a high-frequency filter using a ferromagnetic resonance phenomenon.

SUMMARY

However, it cannot be said that a high-frequency filter that uses this magnetoresistance effect device has sufficient cutoff characteristics.

It is desirable to provide a magnetoresistance effect device having excellent cutoff characteristics.

A plurality of circuit units (elements) are connected in series to each other and each element is connected to a reference electric potential terminal. By finding such a connection relationship, the inventors found that the cutoff characteristics of the magnetoresistance effect device are improved due to filtering the power of the input signal a plurality of times.

That is, the present disclosure provides the following means.

(1) A magnetoresistance effect device including: a first port; a second port;

a first circuit unit and a second circuit unit which are connected in series between the first port and the second port; a shared reference electric potential terminal which is connected to both of the first circuit unit and the second circuit unit, or a first reference electric potential terminal and a second reference electric potential terminal, each of which is connected to the first circuit unit and the second circuit unit, respectively; and a shared DC application terminal configured to be capable of connecting a power supply for applying a DC current or a DC voltage to both of a first magnetoresistance effect element of the first circuit unit and a second magnetoresistance effect element of the second circuit unit, or a first DC application terminal and a second DC application terminal, each of which is configured to be capable of connecting a power supply for applying a DC current or a DC voltage to a first magnetoresistance effect element of the first circuit unit and a second magnetoresistance effect element of the second circuit unit, respectively, wherein the first circuit unit includes the first magnetoresistance effect element including a magnetization fixed layer, a magnetization free layer, and a spacer layer interposed therebetween and a first conductor connected to one end of the first magnetoresistance effect element, wherein the first conductor has a configuration in which a first end portion of the first conductor is connected to a high-frequency current input side and a second end portion of the first conductor is connected to the shared reference electric potential terminal or the first reference electric potential terminal so that a high-frequency current flows to branch to the first magnetoresistance effect element and the shared reference electric potential terminal or the first reference electric potential terminal, wherein the second circuit unit includes the second magnetoresistance effect element including a magnetization fixed layer, a magnetization free layer, and a spacer layer interposed therebetween and a second conductor connected to one end of the second magnetoresistance effect element, and wherein the second conductor has a configuration in which a first end portion of the second conductor is connected to a high-frequency current input side and a second end portion of the second conductor is connected to the shared reference electric potential terminal or the second reference electric potential terminal so that a high-frequency current flows to branch to the second magnetoresistance effect element and the shared reference electric potential terminal or the second reference electric potential terminal.

DETAILED DESCRIPTION

Figure 1:
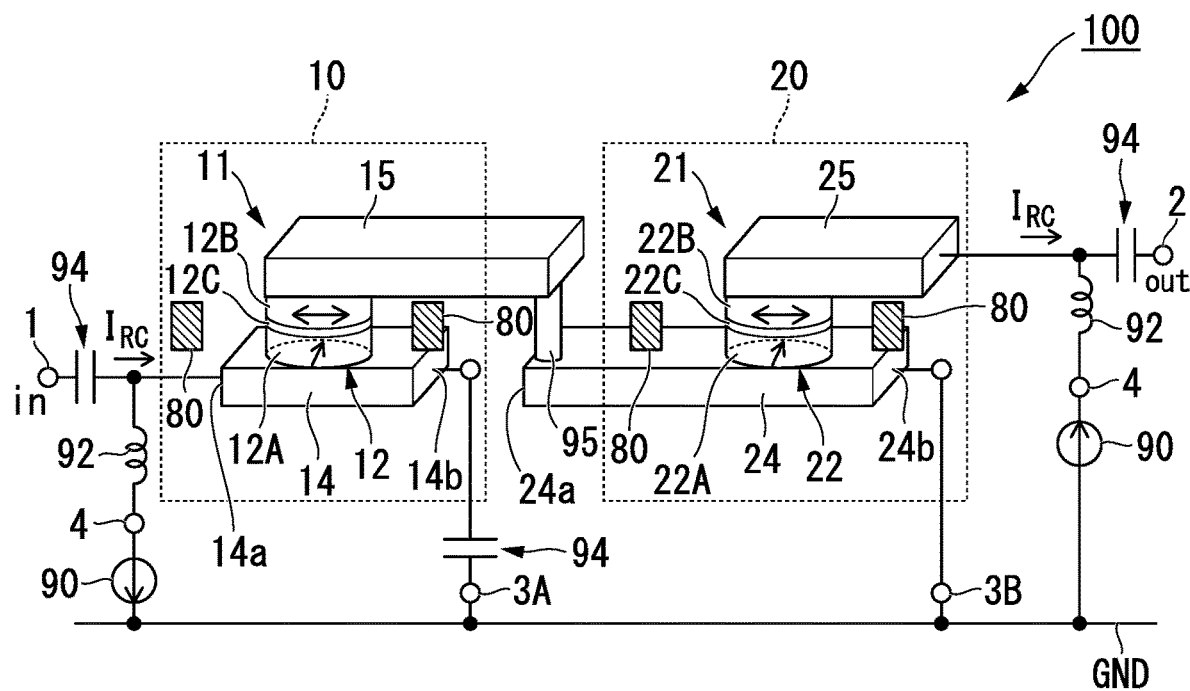
FIG. 1 is a schematic diagram showing a circuit configuration of a magnetoresistance effect module according to a first embodiment.

Hereinafter, a magnetoresistance effect module will be described in detail with reference to the drawings. In the drawings used in the following description, there are cases in which characteristic parts are enlarged for convenience in order to allow characteristics to be understood easily and the dimensional proportions of the components may be different from actual ones. The materials, dimensions, and the like exemplified in the following description are merely examples and the present disclosure is not limited thereto and can be realized while being appropriately modified within a range in which the effects of the present disclosure are exhibited.

First Embodiment

FIG. 1 is a schematic diagram showing a circuit configuration of a magnetoresistance effect module according to a first embodiment. The magnetoresistance effect device includes a first port 1, a second port 2, a first circuit unit 10, a second circuit unit 20, a reference electric potential terminals 3A, 3B, and a DC application terminal 4. A magnetoresistance effect module 100 is obtained by connecting a power supply 90 to the DC application terminal 4. The magnetoresistance effect module 100 outputs a signal from the second port 2 when a signal is input from the first port 1.

<First Port and Second Port>

The first port 1 is an input terminal of the magnetoresistance effect module 100. When an AC signal source (not shown) is connected to the first port 1, an AC signal (a high-frequency signal) can be applied to the magnetoresistance effect module 100. The high-frequency signal applied to the magnetoresistance effect module 100 is, for example, a signal having a frequency of 100 MHz or more. The second port 2 is an output terminal of the magnetoresistance effect module 100.

<First Circuit Unit>

The first circuit unit 10 is connected between the first port 1 and the second port 2. A current branching element 11 is incorporated into the first circuit unit 10. The current branching element 11 includes a first magnetoresistance effect element 12 and a first conductor 14. The first conductor 14 is connected to one end of the first magnetoresistance effect element 12 in the lamination direction. A first end portion 14a of the first conductor 14 is connected to a high-frequency current input side of the first circuit unit 10 and a second end portion 14b of the first conductor 14 is connected to the reference electric potential terminals 3A. A high-frequency current $I_{RC}$ flowing through the first conductor 14 flows to branch to the first magnetoresistance effect element 12 and the reference electric potential terminal 3A.

<First Conductor>

The first conductor 14 is a wiring through which the high-frequency current $I_{RC}$ flows and functions as an electrode provided in the lamination direction of the first magnetoresistance effect element 12. The first conductor 14 is formed of a conductive material. For example, Ta, Cu, Au, AuCu, Ru, Al, or the like can be used in the first conductor 14. Further, a facing electrode 15 may be provided at the other end of the first magnetoresistance effect element 12 in the lamination direction. In this case, the facing electrode 15 is connected to an end portion facing the first conductor 14 of the first magnetoresistance effect element 12. Materials exemplified for the first conductor 14 can be used in the facing electrode 15. The other end of the first magnetoresistance effect element 12 in the lamination direction is connected to a side of output of the high-frequency current $I_{RC}$ in the first circuit unit 10 through the facing electrode 15.

<Magnetoresistance Effect Element>

The first magnetoresistance effect element 12 includes a magnetization fixed layer 12A, a magnetization free layer 12B, and a spacer layer 12C. The spacer layer 12C is located between the magnetization fixed layer 12A and the magnetization free layer 12B. The magnetization of the magnetization fixed layer 12A hardly moves as compared with the magnetization of the magnetization free layer 12B and is fixed to one direction under a predetermined magnetic field environment. The magnetization direction of the magnetization free layer 12B changes relative to the magnetization direction of the magnetization fixed layer 12A, whereby the first magnetoresistance effect element 12 functions.

The magnetization fixed layer 12A is formed of a ferromagnetic material. The magnetization fixed layer 12A is preferably formed of a high spin polarizability material such as Fe, Co, Ni, an alloy of Ni and Fe, an alloy of Fe and Co, an alloy of Fe, Co, and B. When these materials are used, the rate of change in magnetoresistance of the first magnetoresistance effect element 12 increases. Further, the magnetization fixed layer 12A may be formed of a Heusler alloy. The film thickness of the magnetization fixed layer 12A is preferably 1 to 20 nm.

There is no particular limitation on the magnetization fixing method of the magnetization fixed layer 12A. For example, in order to fix the magnetization of the magnetization fixed layer 12A, an antiferromagnetic layer may be added such that it is in contact with the magnetization fixed layer 12A. Further, the magnetization of the magnetization fixed layer 12A may be fixed by using the magnetic anisotropy caused by a crystal structure, shape, or the like. FeO, CoO, NiO, $CuFeS_2$, IrMn, FeMn, PtMn, Cr, or Mn can be used in the antiferromagnetic layer.

The magnetization free layer 12B is formed of a ferromagnetic material of which the magnetization direction can be changed by an externally applied magnetic field or spin-polarized electrical current.

As the material of the magnetization free layer 12B, it is possible to use CoFe, CoFeB, CoFeSi, CoMnGe, CoMnSi, CoMnAl, FeB, Co, a CoCr alloy, a Co multilayer film, a CoCrPt alloy, a FePt alloy, a SmCo alloy including a rare earth, a TbFeCo alloy, or the like. Further, the magnetization free layer 12B may be formed of a Heusler alloy.

The thickness of the magnetization free layer 12B is preferably set to about 0.5 to 20 nm. Further, a high spin polarizability material may be inserted between the magnetization free layer 12B and the spacer layer 12C. It is possible to obtain a high rate of change in magnetoresistance by inserting a high spin polarizability material.

As the high spin polarizability material, a CoFe alloy or a CoFeB alloy may be exemplified. The film thickness of the CoFe alloy or CoFeB alloy is preferably set to about 0.2 to 1.0 nm.

The spacer layer 12C is a layer which is disposed between the magnetization fixed layer 12A and the magnetization free layer 12B. The spacer layer 12C is formed as a layer which is formed of a conductor, an insulator, or a semiconductor or a layer which has a conduction point formed by a conductor in an insulator. The spacer layer 12C is preferably a nonmagnetic layer.

For example, when the spacer layer 12C is formed of an insulator, the first magnetoresistance effect element 12 becomes a Tunneling Magnetoresistance (TMR) effect element. Then, when the spacer layer 12C is formed of metal, the first magnetoresistance effect element becomes a Giant Magnetoresistance (GMR) effect element.

When an insulation material is used as the spacer layer 12C, an insulation material such as $Al_2O_3$, MgO, or $MgAl_2O_4$ can be used. By adjusting the film thickness of the spacer layer 12C so that a coherent tunneling effect between the magnetization fixed layer 12A and the magnetization free layer 12B is exhibited, a high rate of change in magnetoresistance can be obtained. In order to efficiently use the TMR effect, the film thickness of the spacer layer 12C is preferably about 0.5 to 3.0 nm.

When the spacer layer 12C is formed of a conductive material, a conductive material such as Cu, Ag, Au, or Ru can be used. In order to efficiently use the GMR effect, the film thickness of the spacer layer 12C is preferably about 0.5 to 3.0 nm.

When the spacer layer 12C is formed of a semiconductor material, a material such as ZnO, $In_2O_3$, $SnO_2$, ITO, GaOx, or $Ga_2Ox$ can be used. In this case, the film thickness of the spacer layer 12C is preferably about 1.0 to 4.0 nm.

When a layer having a conduction point formed of a conductor in a nonmagnetic insulator is applied as the spacer layer 12C, a structure having a conduction point formed by a conductor such as CoFe, CoFeB, CoFeSi, CoMnGe, CoMnSi, CoMnAl, Fe, Co, Au, Cu, Al, or Mg in a nonmagnetic insulator formed of $Al_2O_3$ or MgO is preferable. In this case, the film thickness of the spacer layer 12C is preferably about 0.5 to 2.0 nm.

A cap layer may be provided between the magnetization free layer 12B and the first conductor 14. Further, a seed layer or a buffer layer may be disposed between the first magnetoresistance effect element 12 and the facing electrode 15. As the cap layer, the seed layer, or the buffer layer, a metal film of Ru, Ta, Cu, Cr, or the like, an oxide film of MgO or the like, or a laminated film of these materials is exemplified. When these layers are formed as an oxide film, the layer thicknesses thereof are thin enough to allow a current to flow therethrough. For example, it is preferable that the thickness be of such a degree that a current (including a tunnel current) flows when a voltage of 3 V is applied in the lamination direction of the first magnetoresistance effect element 12. Specifically, the thickness is preferably 5 nm or less.

The size of the first magnetoresistance effect element 12 is desirably such that the long side of the shape of the first magnetoresistance effect element 12 in a plan view is 500 nm or less. Further, the short side of the shape of the first magnetoresistance effect element 12 in a plan view is preferably 50 nm or more. When the shape of the first magnetoresistance effect element 12 in a plan view is not a rectangular shape (including a square shape), the long side of a rectangle circumscribing the shape of the first magnetoresistance effect element 12 in a plan view with the minimum area is defined as the long side of the shape of the first magnetoresistance effect element 12 in a plan view and the short side of a rectangle circumscribing the shape of the first magnetoresistance effect element 12 in a plan view with the minimum area is defined as the short side of the shape of the first magnetoresistance effect element 12 in a plan view.

When the long side is as small as 500 nm or less, the volume of the magnetization free layer 12B decreases and hence a highly efficient ferromagnetic resonance phenomenon can be realized. Here, the "shape in a plan view" indicates a shape when viewed from the lamination direction of respective layers constituting the first magnetoresistance effect element 12.

<Second Circuit Unit>

The second circuit unit 20 is connected between the first port 1 and the second port 2. In FIG. 1, the second circuit unit 20 is connected between the first circuit unit 10 and the second port 2 and the first circuit unit 10 and the second circuit unit 20 are connected in series to each other. A current branching element 21 which is similar to the current branching element 11 incorporated into the first circuit unit 10 is incorporated into the second circuit unit 20.

The current branching element 21 shown in FIG. 1 includes a second magnetoresistance effect element 22 and a second conductor 24. The second conductor 24 is connected to one end of the second magnetoresistance effect element 22 in the lamination direction. A first end portion 24a of the second conductor 24 is connected to a side of input of the high-frequency current $I_{RC}$ of the second circuit unit 20 and a second end portion 24b of the second conductor 24 is connected to the reference electric potential terminal 3B. The high-frequency current $I_{RC}$ flowing through the second conductor 24 flows to branch to the second magnetoresistance effect element 22 and the reference electric potential terminal 3B. The second magnetoresistance effect element 22 includes a magnetization fixed layer 22A, a magnetization free layer 22B, and a spacer layer 22C, one end in the lamination direction is provided with the second conductor 24, and the other end in the lamination direction is provided with a facing electrode 25. In the second magnetoresistance effect element 22, the second conductor 24, and the facing electrode 25 are the same as those exemplified for the first conductor 14, and the facing electrode 15 used in the first magnetoresistance effect element 12. In FIG. 1, the second conductor 24 is connected to the facing electrode 15 of the first circuit unit 10 by a via wiring 95. The other end of the second magnetoresistance effect element 22 in the lamination direction is connected to the output side (the second port 2) of the high-frequency current $I_{RC}$ of the second circuit unit 20 through the facing electrode 25.

<Reference Electric Potential Terminal>

The reference electric potential terminals 3A and 3B are connected to the first circuit unit 10 and the second circuit unit 20, respectively. The reference electric potential terminals 3A, 3B are connected to the reference potential to determine the reference potential of the magnetoresistance effect module 100. In FIG. 1, the reference electric potential terminal is connected to a ground GND which is a reference potential. The ground GND is provided outside of the magnetoresistance effect module 100. In FIG. 1, the reference electric potential terminal 3A is connected (connected in an AC manner (in a high frequency manner)) to the first circuit unit 10 via the capacitor 94 and the reference electric potential terminal 3B is connected to the second circuit unit 20. Further, in FIG. 1, the reference electric potential terminal 3B is connected to the first circuit unit 10 via the second circuit unit 20. The high-frequency current $I_{RC}$ which is input to the first port 1 flows through the first circuit unit 10 and the second circuit unit 20 in response to a potential difference with respect to the reference potential. In FIG. 1, the reference electric potential terminals 3A, 3B are provided to each of the first circuit unit 10 and the second circuit unit 20 separately. However, they can be integrated into a single unit shared by the first circuit unit 10 and the second circuit unit 20 (for example, a modified example to be described later).

<DC Application Terminal>

The DC application terminal 4 is connected to the power supply 90 and applies a DC current or a DC voltage in the lamination direction of the first magnetoresistance effect element 12 and the second magnetoresistance effect element 22. The first magnetoresistance effect element 12 is connected to the DC application terminal 4 capable of connecting the power supply 90 for applying a DC current or a DC voltage to the first magnetoresistance effect element 12. The second magnetoresistance effect element 22 is connected to the DC application terminal 4 capable of connecting the power supply 90 for applying a DC current or a DC voltage to the second magnetoresistance effect element 22. In the specification, the DC current indicates a current of which a direction does not change in accordance with time and also includes a current of which a value changes in accordance with time. Further, the DC voltage indicates a voltage of which a polarity does not change in accordance with time and also includes a voltage of which a value changes in accordance with time. The power supply 90 may be a DC current source or a DC voltage source. The power supply 90 may be a DC current source capable of generating a constant DC current or a DC voltage source capable of generating a constant DC voltage. Further, the power supply 90 may be a DC current source of which a generated DC current value changes or a DC voltage source of which a generated DC voltage value changes. In the magnetoresistance effect module 100 shown in FIG. 1, the flow direction of the DC current flowing through the first magnetoresistance effect element 12 and the second magnetoresistance effect element 22 is the same and the DC current flows in an order of the magnetization free layers 12B and 22B, the spacer layers 12C and 22C, and the magnetization fixed layers 12A and 22A.

The current density of the DC current applied to each of the first magnetoresistance effect element 12 and the second magnetoresistance effect element 22 is preferably smaller than the oscillation threshold current density of each of the first magnetoresistance effect element 12 and the second magnetoresistance effect element 22. The oscillation threshold current density of each of the first magnetoresistance effect element 12 and the second magnetoresistance effect element 22 is a current density of a threshold value at which the magnetization of each of the magnetization free layers 12B and 22B starts to move in precession at a constant frequency and a constant amplitude in accordance with the application of a current of the threshold current density or more and the first magnetoresistance effect element 12 and the second magnetoresistance effect element 22 oscillate (the output (the resistance value) of the first magnetoresistance effect element 12 and the second magnetoresistance effect element 22 changes at a constant frequency and a constant amplitude).

<Other Configurations>

An inductor 92 and a capacitor 94 are disposed in the magnetoresistance effect module 100. The inductor 92 cuts a high-frequency component of a current and passes an invariant component of the current. The capacitor 94 passes a high-frequency component of a current and cuts an invariant component of the current. The inductor 92 is disposed at a portion for suppressing the flow of the high-frequency current $I_{RC}$ and the capacitor 94 is disposed at a portion for suppressing the flow of the DC current. In FIG. 1, the inductor 92 suppresses the high-frequency current applied from the first port 1 from flowing and dissipating to the reference electric potential. Further, the capacitor 94 suppresses the DC current applied from the power supply 90 being flowing to the first port 1 and the second port 2 to be dissipated; and the DC current applied from the power supply 90 being flowing to the first conductor 14 from the reference electric potential terminal 3A.

As the inductor 92, a chip inductor, an inductor having a pattern line, a resistance element having an inductor component, or the like can be used. The inductance of the inductor 92 is preferably 10 nH or more. A known capacitor can be used as the capacitor 94.

Each circuit unit and each terminal are connected by a signal line. The shape of the signal line is preferably defined as a microstrip line (MSL) type or a coplanar waveguide (CPW) type. When designing the microstrip line (MSL) type or the coplanar waveguide (CPW) type, it is preferable to design the line width and the ground distance so that the characteristic impedance of the signal line becomes equal to the impedance of the circuit system. With such a design, the transmission loss of the signal line can be suppressed.

Further, the magnetoresistance effect module 100 preferably includes a frequency setting mechanism 80. The frequency setting mechanism 80 is a magnetic field application mechanism which applies an external magnetic field corresponding to a static magnetic field to the first magnetoresistance effect element 12 and the second magnetoresistance effect element 22. The frequency setting mechanism 80 sets the ferromagnetic resonance frequency of each of the magnetization free layers 12B and 22B of the first magnetoresistance effect element 12 and the second magnetoresistance effect element 22. The frequency of the signal output from the magnetoresistance effect module 100 changes according to the ferromagnetic resonance frequencies of the magnetization free layers 12B and 22B. That is, the frequency of the output signal can be set by the frequency setting mechanism 80.

The frequency setting mechanism 80 may be provided in each of the first magnetoresistance effect element 12 and the second magnetoresistance effect element 22 or may be provided as an integrated single unit. The frequency setting mechanism 80 is formed as, for example, an electromagnetic type or stripline type magnetic field applying mechanism capable of variably controlling the applied magnetic field strength by either voltage or current. Further, the frequency setting mechanism may be formed as a combination of an electromagnet type or stripline type magnetic field applying mechanism capable of variably controlling the applied magnetic field strength and a permanent magnet supplying only a constant magnetic field.

<Function of Magnetoresistance Effect Device>

When a high-frequency signal is input from the first port 1 to the magnetoresistance effect module 100, the high-frequency current $I_{RC}$ corresponding to the high-frequency signal flows to the first circuit unit 10. The high-frequency current $I_{RC}$ flows to branch to the first magnetoresistance effect element 12 and the reference electric potential terminal 3A.

The magnetization of the magnetization free layer 12B is mainly vibrated by receiving the high-frequency magnetic field generated by the high-frequency current $I_{RC}$ flowing through the first conductor 14. Due to the ferromagnetic resonance phenomenon, the magnetization of the magnetization free layer 12B is largely vibrated when the frequency of the high-frequency current $I_{RC}$ is in the vicinity of the ferromagnetic resonance frequency of the magnetization free layer 12B. When the vibration of the magnetization of the magnetization free layer 12B increases, a change in resistance value of the first magnetoresistance effect element 12 increases. A change in resistance value is output from the first magnetoresistance effect element 12 (the first circuit unit 10) when the DC current is applied in the lamination direction of the first magnetoresistance effect element 12. The sum of the output due to a change in resistance value caused by the ferromagnetic resonance phenomenon and the output due to the high-frequency current $I_{RC}$ flowing to branch to the first magnetoresistance effect element 12 is output from the first magnetoresistance effect element 12 (the first circuit unit 10).

Next, the high-frequency current $I_{RC}$ output from the first circuit unit 10 flows through the second circuit unit 20. Also in the second circuit unit 20, the high-frequency current $I_{RC}$ flows to branch to the second magnetoresistance effect element 22 and the reference electric potential terminal 3B similarly to the first circuit unit 10. Then, the magnetization of the magnetization free layer 22B is largely vibrated when the frequency of the high-frequency current $I_{RC}$ is in the vicinity of the ferromagnetic resonance frequency of the magnetization free layer 22B.

When the vibration of the magnetization of the magnetization free layer 22B increases, a change in resistance value of the second magnetoresistance effect element 22 increases. A change in resistance value is output from the second magnetoresistance effect element 22 (the second circuit unit 20) when the DC current is applied in the lamination direction of the second magnetoresistance effect element 22. The sum of the output due to a change in resistance value according to the ferromagnetic resonance phenomenon and the output due to the high-frequency current $I_{RC}$ flowing to branch to the second magnetoresistance effect element 22 is output from the second magnetoresistance effect element 22 (the second circuit unit 20) and is output from the second port 2.

That is, when the frequency of the high-frequency signal input from the first port 1 is in the vicinity of the ferromagnetic resonance frequencies of the magnetization free layers 12B and 22B, the resistance value change amount of each of the first magnetoresistance effect element 12 and the second magnetoresistance effect element 22 is large and a large signal is output from the second port 2. In contrast, when the frequency of the high-frequency signal is deviated from the ferromagnetic resonance frequencies of the magnetization free layers 12B and 22B, the resistance value change amount of each of the first magnetoresistance effect element 12 and the second magnetoresistance effect element 22 is small and an output due to a change in resistance value according to the ferromagnetic resonance phenomenon is not substantially output from the second port 2.

Figure 2:
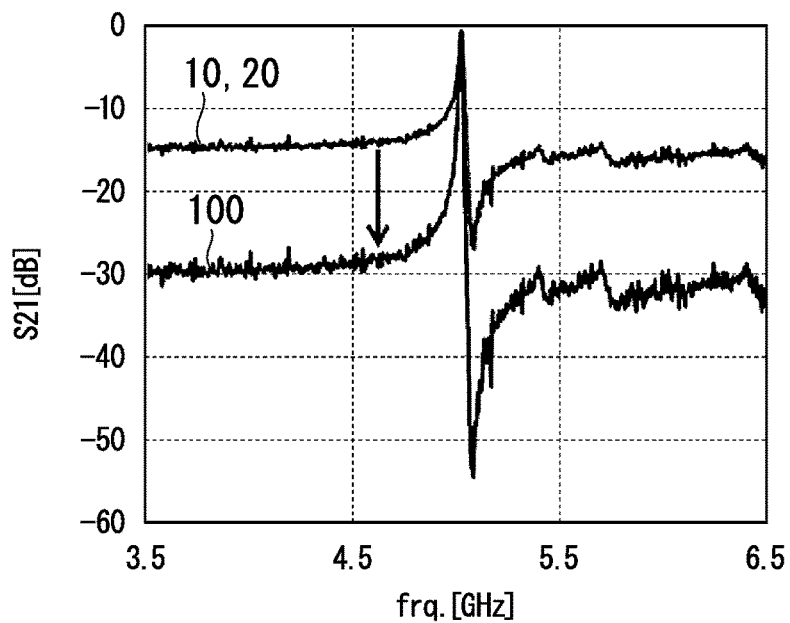
FIG. 2 is a schematic diagram showing signal characteristics when a first circuit unit and a second circuit unit are independent and signal characteristics when the first circuit unit and the second circuit unit are connected in series.

FIG. 2 is a schematic diagram showing the signal characteristics of the magnetoresistance effect module 100 when the first circuit unit 10 and the second circuit unit 20 are independent from each other and the signal characteristics of the magnetoresistance effect module 100 in which the first circuit unit 10 and the second circuit unit 20 are connected in series to each other. The signal characteristics correspond to a ratio of output power with respect to input power. As shown in FIG. 2, the first circuit unit 10 and the second circuit unit 20 individually exhibit anti-Lorentzian-like signal characteristics. The anti-lorentzian signal characteristics are signal characteristics that can be fitted by an antisymmetric Cauchy-Lorentz distribution and the anti-Lorentzian-like signal characteristics are signal characteristics having two peaks, that are, a peak at which the pass characteristic is increased and a peak at which the pass characteristic is decreased.

As shown in FIG. 2, in the signal characteristics of the magnetoresistance effect module 100 in which the first circuit unit 10 and the second circuit unit 20 are connected in series to each other, the cutoff characteristics are excellent as compared with the signal characteristics when the first circuit unit 10 and the second circuit unit 20 are independent from each other. It is considered that this is caused by the second end portion 14b of the first conductor 14 and the second end portion 24b of the second conductor 24 connected to the reference electric potential terminal 3A and the reference electric potential terminal 3B, respectively.

For the frequency deviated from the ferromagnetic resonance frequency of the magnetization free layer 12B, the output due to the high-frequency current $I_{RC}$ flowing to branch to the first magnetoresistance effect element 12 is output from the first circuit unit 10 and is input to the second circuit unit 20. The high-frequency current $I_{RC}$ input to the second circuit unit 20 flows to branch to the second magnetoresistance effect element 22 and the reference electric potential terminal 3B. For the frequency deviated from the ferromagnetic resonance frequency of the magnetization free layer 22B, the output due to the high-frequency current $I_{RC}$ flowing to branch to the second magnetoresistance effect element 22 is output from the second circuit unit 20 and is output from the second port 2.

The high-frequency current $I_{RC}$ of the frequency deviated from the ferromagnetic resonance frequency of the magnetization free layer 12B and the ferromagnetic resonance frequency of the magnetization free layer 22B decreases when the current is branched at the first circuit unit 10 (the current branching element 11) and the second circuit unit 20 (the current branching element 12). As a result, the output from the second port 2 decreases in the frequency deviated from the ferromagnetic resonance frequency of the magnetization free layer 12B and the ferromagnetic resonance frequency of the magnetization free layer 22B. In this way, since the branching of the high-frequency current $I_{RC}$ is repeated, the cutoff characteristics of the magnetoresistance effect module 100 are improved. As for the signal characteristics of the magnetoresistance effect module 100, the cutoff characteristics in a frequency region other than the passband are excellent. By using the signal characteristics, the magnetoresistance effect module 100 (or the magnetoresistance effect device) can be used as a high-frequency filter capable of selectively passing a high-frequency signal at a specific frequency.

Here, a relationship (a magnitude relationship of the frequency) of the ferromagnetic resonance frequencies of the magnetization free layer 12B of the first magnetoresistance effect element 12 and the magnetization free layer 22B of the second magnetoresistance effect element 22 is not particularly limited. When two ferromagnetic resonance frequencies are the same or close to each other, the pass bandwidth becomes narrow and a difference (ΔS21) between the pass characteristic and the cutoff characteristic increases. On the other hand, when two ferromagnetic resonance frequencies deviate from each other, the pass bandwidth becomes wide and hence ΔS21 decreases. For that reason, the ferromagnetic resonance frequencies can be appropriately designed according to the required application and usage mode.

Although the embodiments of the present disclosure have been described above in detail with reference to the drawings, the respective configurations and combinations thereof in each embodiment are merely examples and additions, omissions, substitutions, and other modifications of the configurations can be made without departing from the spirit of the present disclosure.

In FIG. 1, the first circuit unit 10 and the second circuit unit 20 are connected in series to each other, but three or more current branching elements (three or more circuit units including the current branching elements) may be connected in series to one another. In that configuration, since the branching of the high-frequency current $I_{RC}$ is repeated more, the cutoff characteristics of the magnetoresistance effect module are more improved.

Figure 3:
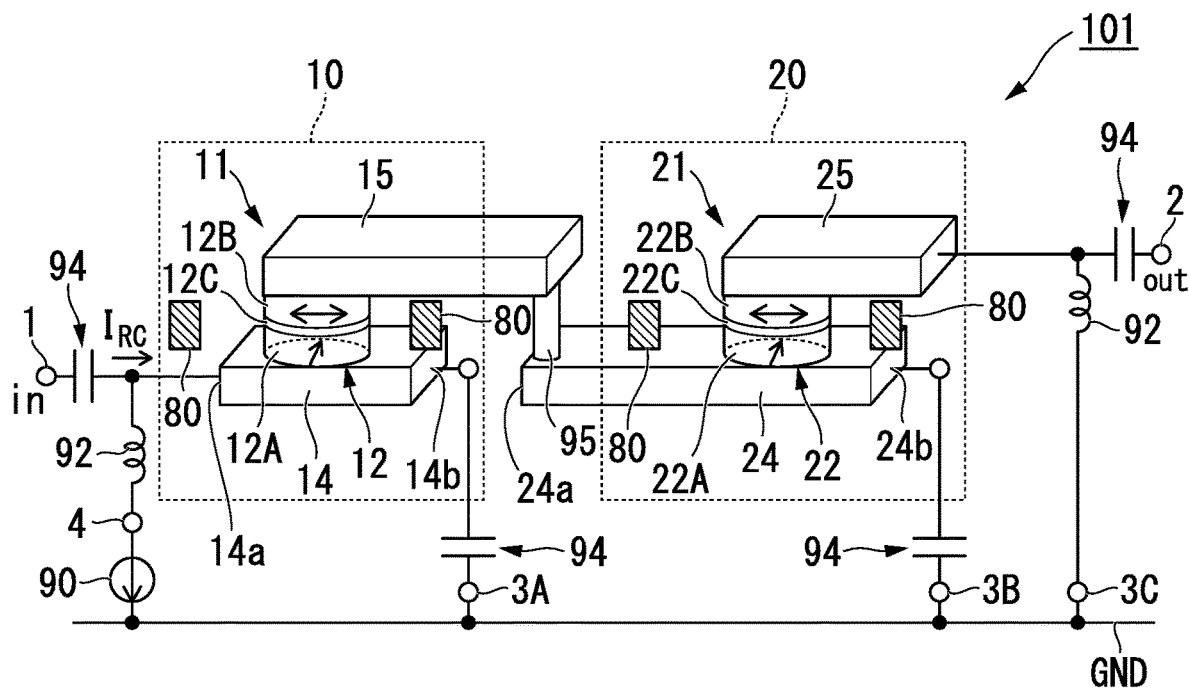
FIG. 3 is a schematic diagram showing a circuit configuration of another example of the magnetoresistance effect module according to the first embodiment.

FIG. 3 is a schematic diagram showing a circuit configuration of another example of the magnetoresistance effect module according to the first embodiment. In FIG. 3, the same reference numerals are give to the same configurations as those of FIG. 1. A magnetoresistance effect module 101 shown in FIG. 3 is different from the magnetoresistance effect module 100 shown in FIG. 1 in that the first magnetoresistance effect element 12 and the second magnetoresistance effect element 22 share the DC application terminal 4 and the power supply 90. Since the magnetoresistance effect module 101 shares the DC application terminal 4 and the power supply 90, the element configuration is simplified and hence the module can be decreased in size.

In the magnetoresistance effect module 101 shown in FIG. 3, the facing electrode 25 is connected to the reference electric potential terminal 3C through the inductor 92. Further, the capacitor 94 is provided between the first port 1 and the first end portion 14a of the first conductor 14, between the second end portion 14b of the first conductor 14 and the reference electric potential terminal 3A, between the second end portion 24b of the second conductor 24 and the reference electric potential terminal 3B, and between the facing electrode 25 and the second port 2. In FIG. 3, the reference electric potential terminal 3A is connected (connected in an AC manner (in a high frequency manner)) to the first circuit unit 10 via the capacitor 94, and the reference electric potential terminal 3B is connected (connected in an AC manner (in a high frequency manner)) to the second circuit unit 20 via the capacitor 94. Further, in FIG. 3, the reference electric potential terminal 3C is connected (connected in a DC manner) to the second circuit unit 20 via the inductor 92. Further, in FIG. 3, the reference potential electric terminal 3C is connected (connected in a DC manner) to the first circuit unit 10 via the inductor 92 and the second circuit unit 20. By the capacitor 94, the direct current applied from the power supply 90 is suppressed from: flowing from the reference electric potential terminal 3A to the first conductor 14; and flowing from the reference electric potential terminal 3B to the second conductor 24, to flow to the first magnetoresistance effect element 12 and the second magnetoresistive effect element 22. The first magnetoresistance effect element 12 and the second magnetoresistance effect element 22 are in series connection relation with reference to the direct current application terminal 4, and the direct current applied from the power supply 90 flows through the facing electrode 25, the second magnetoresistive effect element 22, the second conductor 24, the via wiring 95, the facing electrode 15, and the first magnetoresistive effect element 12 in this order. The flow of the high frequency current $I_{RC}$ is the same as that shown in FIG. 1. Thus, the magnetoresistance effect module 101 shown in FIG. 3 has excellent cutoff characteristics.

Figure 4:
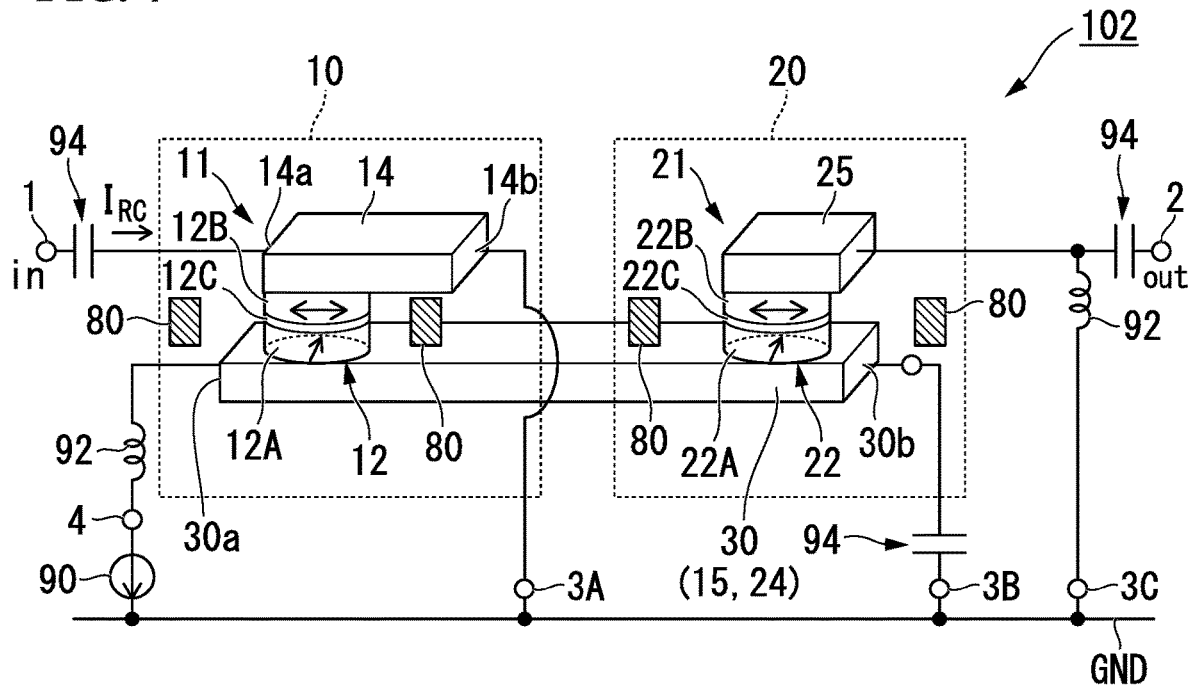
FIG. 4 is a schematic diagram showing a circuit configuration of another example of the magnetoresistance effect module according to the first embodiment.

Further, FIG. 4 is a schematic diagram showing a circuit configuration of another example of the magnetoresistance effect module according to the first embodiment. In FIG. 4, the same reference numerals are given to the same configurations as those of FIG. 3. A magnetoresistance effect module 102 shown in FIG. 4 is different from the magnetoresistance effect module 101 shown in FIG. 3 in that the facing electrode 15 of the first magnetoresistance effect element 12 and the second conductor 24 of the second magnetoresistance effect element 22 are formed as a metal layer 30 integrally. In FIG. 4, the reference electric potential terminal 3A is connected to the first circuit unit 10, and the reference electric potential terminal 3B is connected (connected in an AC manner (in a high frequency manner)) to the second circuit unit 20 via the capacitor 94. Further, in FIG. 4, the reference electric potential terminal 3C is connected (connected in a DC manner) to the second circuit unit 20 via the inductor 92.

In the magnetoresistance effect module 102 shown in FIG. 4, since the facing electrode 15 and the second conductor 24 are formed as the metal layer 30 integrally, it is not necessary to connect these members by the wiring 95 (see FIG. 1). The wiring 95 can be a factor that increases an element resistance. Since the facing electrode 15 and the second conductor 24 are formed as the metal layer 30 integrally, an increase in element resistance can be suppressed. Further, since a space for providing the wiring 95 is not necessary, the magnetoresistance effect module 102 can be decreased in size.

In the magnetoresistance effect module 102 shown in FIG. 4, the first magnetoresistance effect element 12 and the second magnetoresistance effect element 22 are laminated on the same surface of the metal layer 30. The first magnetoresistance effect element 12 and the second magnetoresistance effect element 22 may be connected to different surfaces of the metal layer 30, but are preferably laminated on the same surface of the metal layer 30.

When the first magnetoresistance effect element 12 and the second magnetoresistance effect element 22 are laminated on the same surface of the metal layer 30, the magnetoresistance effect module 102 can be easily manufactured. In the first magnetoresistance effect element 12 and the second magnetoresistance effect element 22, the lamination order of the magnetization fixed layers 12A and 22A, the spacer layers 12C and 22C, and the magnetization free layers 12B and 22B are the same. That is, the first magnetoresistance effect element 12 and the second magnetoresistance effect element 22 can be manufactured at one time by laminating a layer formed as the first magnetoresistance effect element 12 and the second magnetoresistance effect element 22 on the metal layer 30, which functions as the facing electrode 15 and the second conductor 24, and removing unnecessary parts by techniques such as photolithography.

In the magnetoresistance effect module 102 shown in FIG. 4, the first end portion 30a of the metal layer 30 is connected to the DC application terminal 4. Further, the capacitor 94 is provided between the first port 1 and the first end portion 14a of the first conductor 14, between the second end portion 30b of the metal layer 30 and the reference electric potential terminal 3B, and between the facing electrode 25 and the second port 2. By disposing the capacitor 94 at the position, the direct current applied from the power supply 90 flows: from the reference electric potential terminal 3A to the DC application terminal 4 via the first conductor 14, the first magnetoresistance effect element 12, and the metal layer 30; from the reference electric potential terminal 3C to the DC application terminal 4 via the inductor 92, the facing electrode 25, the second magnetoresistance effect element 22 and the metal layer 30. That is, the first magnetoresistance effect element 12 and the second magnetoresistance effect element 22 are in a parallel connection relationship with reference to the DC application terminal 4 and the DC current applied from the power supply 90 flows to branch to the first magnetoresistance effect element 12 and the second magnetoresistance effect element 22. The flow direction of the DC current flowing through the first magnetoresistance effect element 12 and the second magnetoresistance effect element 22 is the same and the DC current flows in order of the magnetization free layers 12B and 22B, the spacer layers 12C and 22C, and the magnetization fixed layers 12A and 22A.

Figure 5:
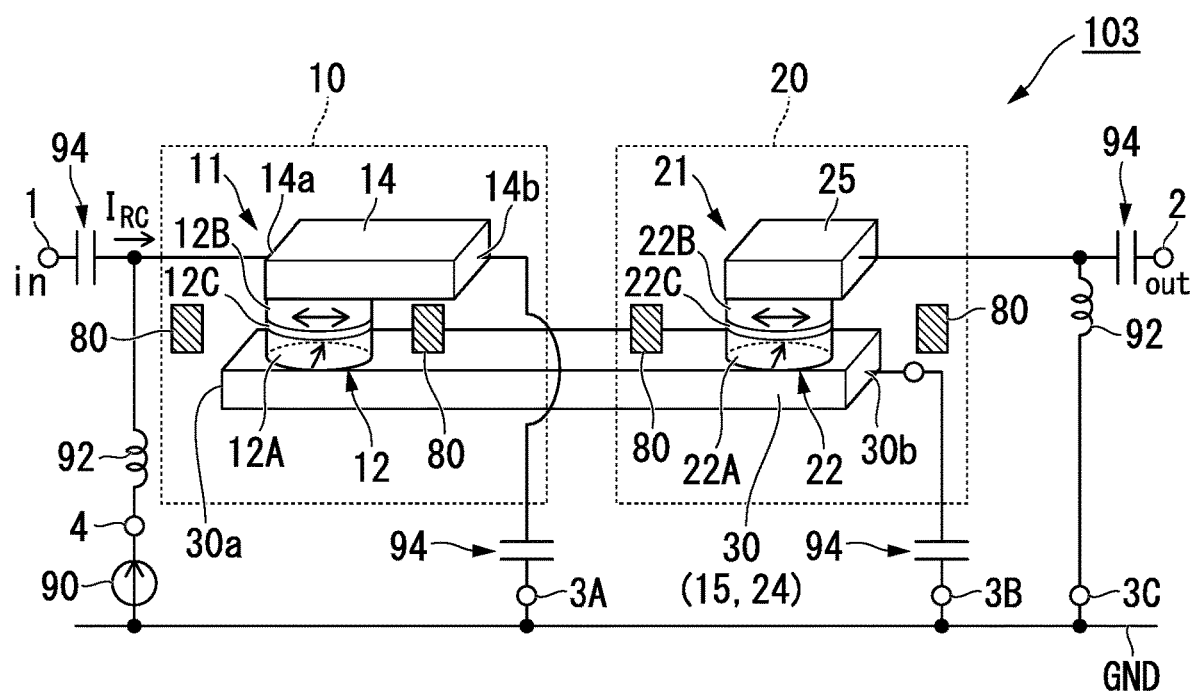
FIG. 5 is a schematic diagram showing a circuit configuration of another example of the magnetoresistance effect module according to the first embodiment.

FIG. 5 is a schematic diagram showing a circuit configuration of another example of the magnetoresistance effect module according to the first embodiment. In FIG. 5, the same reference numerals are given to the same configurations as those of FIG. 4. A magnetoresistance effect module 103 shown in FIG. 5 is different from the magnetoresistance effect module 102 shown in FIG. 4 in that the first magnetoresistance effect element 12 and the second magnetoresistance effect element 22 are in a series connection relationship with reference to the DC application terminal 4. In FIG. 5, the reference electric potential terminal 3A is connected (connected in an AC manner (in a high frequency manner)) to the first circuit unit 10 via the capacitor 94, and the reference electric potential terminal 3B is connected (connected in an AC manner (in a high frequency manner)) to the second circuit unit 20. Further, in FIG. 5, the reference electric potential terminal 3C is connected (connected in a DC manner) to the second circuit unit 20 via the inductor 92. Further, in FIG. 5, the reference electric potential terminal 3C is connected (connected in a DC manner) to the first circuit unit 10 via the inductor 92 and the second circuit unit 20.

In the magnetoresistance effect module 103 shown in FIG. 5, the first end portion 14a of the first conductor 14 is connected to the DC application terminal 4. Further, the capacitor 94 is provided between the first port 1 and the first end portion 14a of the first conductor 14, between the second end portion 14b of the first conductor 14 and the reference electric potential terminal 3A, between the second end portion 30b of the metal layer 30 and the reference electric potential terminal 3B, and between the facing electrode 25 and the second port 2. Since the capacitor 94 is disposed at that position, the DC current applied from the power supply 90 flows in order of the first magnetoresistance effect element 12, the metal layer 30, and the second magnetoresistance effect element 22. The flow direction of the DC current flowing through the first magnetoresistance effect element 12 and the second magnetoresistance effect element 22 is opposite to each other. In the first magnetoresistance effect element 12, the current flows in order of the magnetization free layer 12B, the spacer layer 12C, and the magnetization fixed layer 12A. Then, in the second magnetoresistance effect element 22, the current flows in order of the magnetization fixed layer 22A, the spacer layer 22C, and the magnetization free layer 22B.

In the magnetoresistance effect modules 102 and 103 shown in FIGS. 4 and 5, the inductor 92 is provided between the first port 1 and the DC application terminal 4, and between the second port 2 and the reference electric potential terminal 3C. The high-frequency current $I_{RC}$ input from the first port 1 flows through each of the first magnetoresistance effect element 12 and the second magnetoresistance effect element 22 while being branched to the reference electric potential terminal 3A at the second end portion 14b of the first conductor 14 and the reference electric potential terminal 3B at the second end portion 30b of the metal layer 30, respectively. For that reason, also in the magnetoresistance effect modules 102 and 103 shown in FIGS. 4 to 5, the branching of the high-frequency current $I_{RC}$ is repeated and hence cutoff characteristics are improved.

Figure 6:
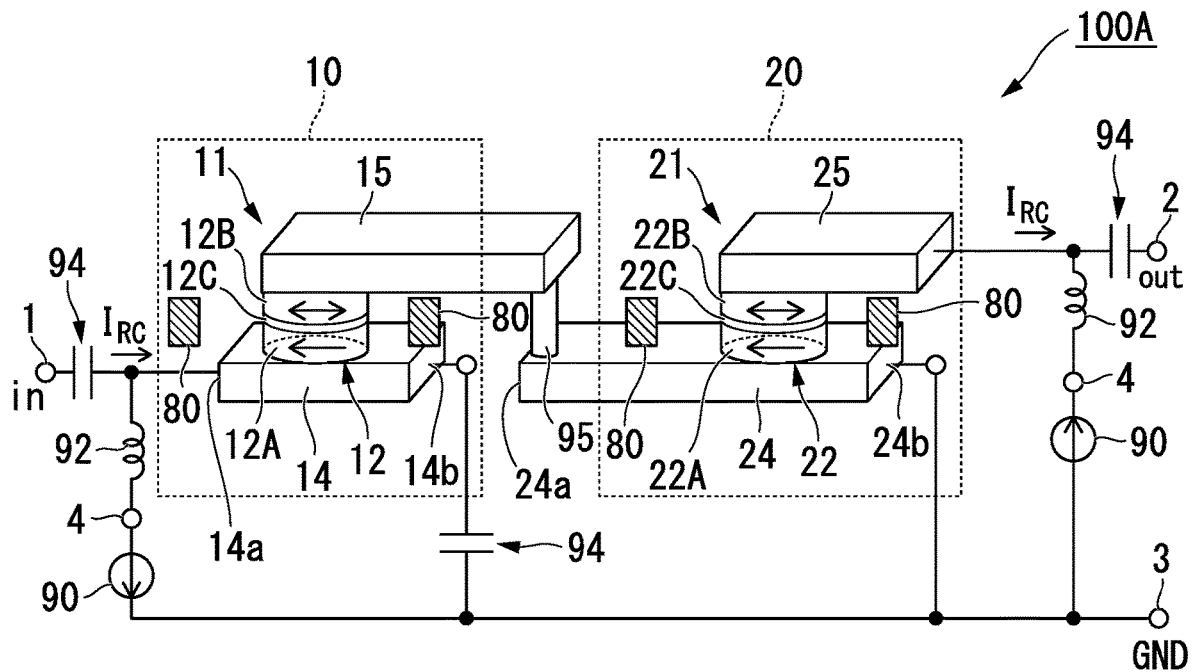
FIG. 6 is a schematic diagram showing circuit configuration of a modified example of the magnetoresistance effect module according to the first embodiment shown in FIG. 1.
Figure 7:
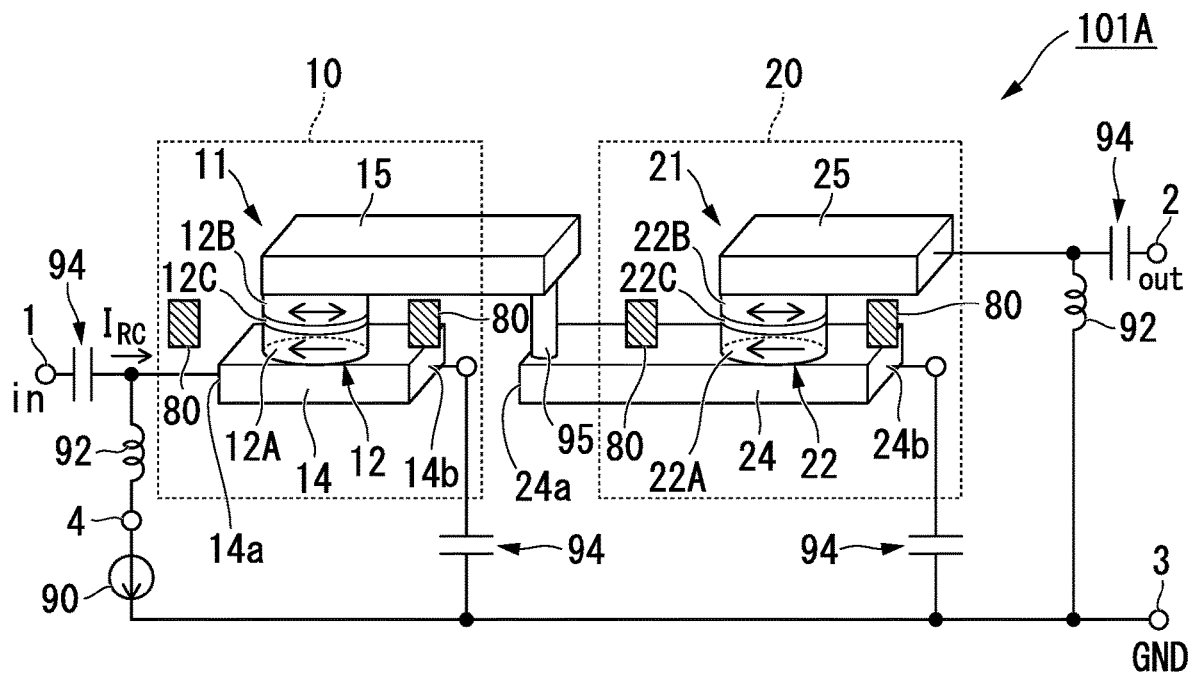
FIG. 7 is a schematic diagram showing circuit configuration of a modified example of the magnetoresistance effect module according to the first embodiment shown in FIG. 3.
Figure 8:
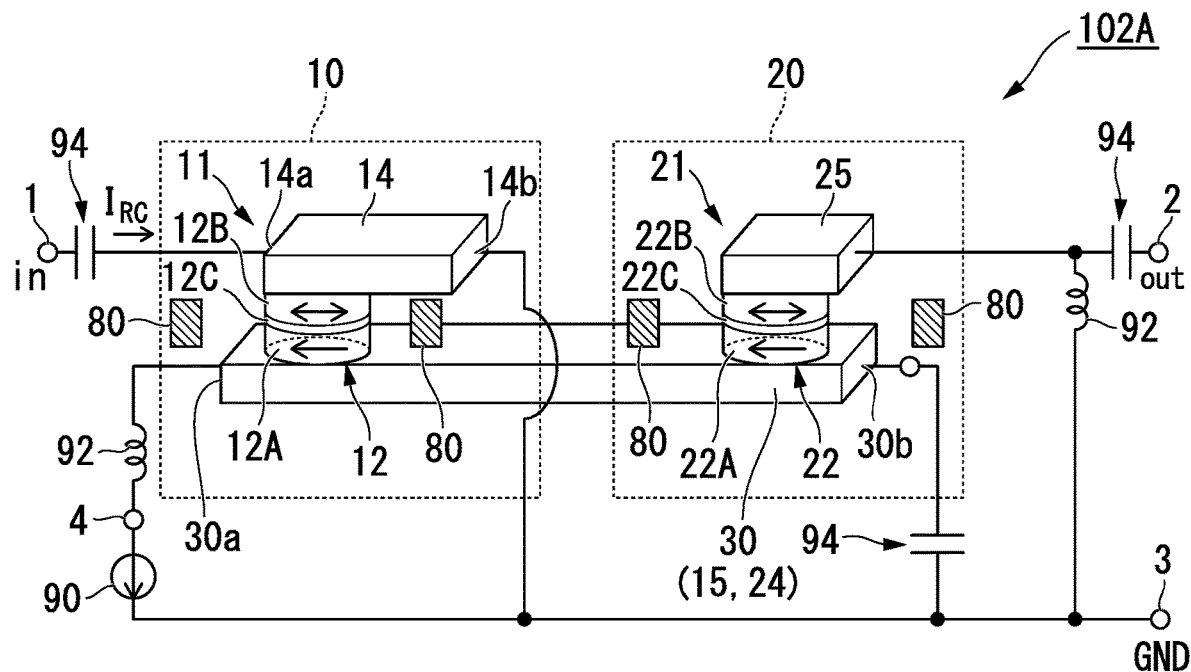
FIG. 8 is a schematic diagram showing circuit configuration of a modified example of the magnetoresistance effect module according to the first embodiment shown in FIG. 4.
Figure 9:
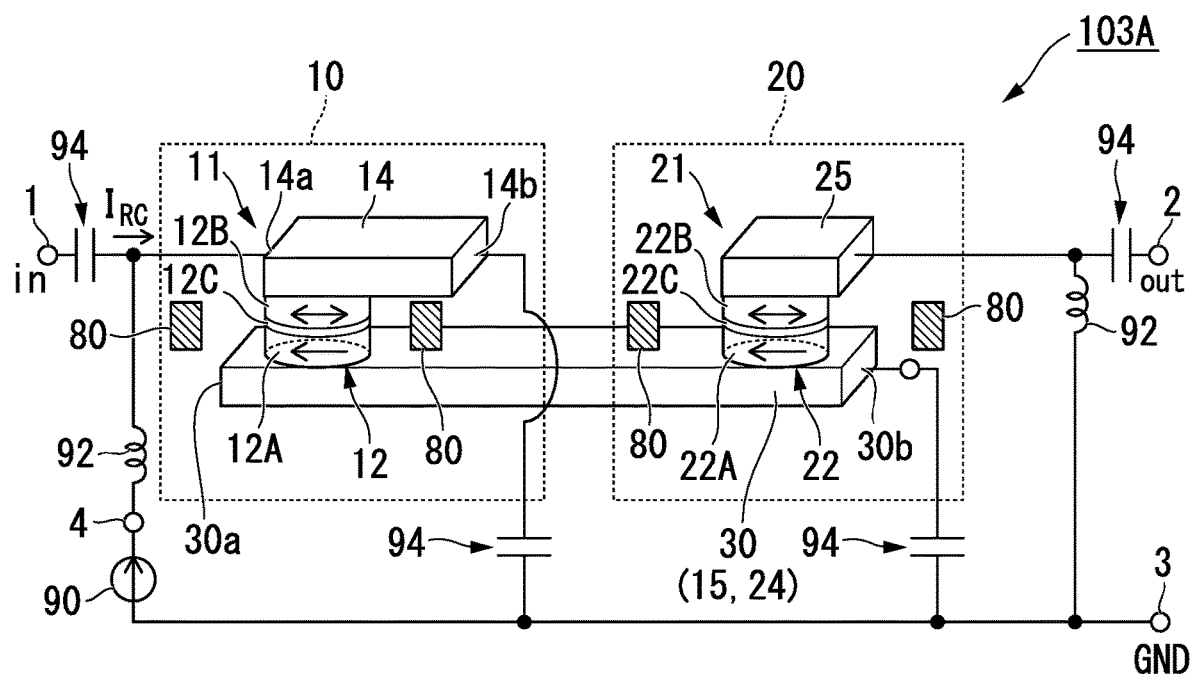
FIG. 9 is a schematic diagram showing circuit configuration of a modified example of the magnetoresistance effect module according to the first embodiment shown in FIG. 5.

FIG. 6 is a schematic diagram showing a circuit configuration of a modified example of the magnetoresistive effect module 100 shown in FIG. 1. FIG. 7 is a schematic diagram showing a circuit configuration of a modified example of the magnetoresistive effect module 101 shown in FIG. 3. FIG. 8 is a schematic diagram showing a circuit configuration of a modified example of the magnetoresistance effect module 102 shown in FIG. 4. FIG. 9 is a schematic diagram showing a circuit configuration of a modified example of the magnetoresistive effect module 103 shown in FIG. 5. In the magnetoresistive effect modules 100 A, 101 A, 102 A, 103 A shown in FIGS. 6 to 9, the reference potential terminal 3 is integrated into a single unit shared by the first circuit unit 10 and the second circuit unit 20. Further, the power supply 90 is incorporated in the circuits of the magnetoresistance effect modules 100A, 101A, 102A, 103A. Even in the configuration of these modified examples, the branching of the high frequency current $I_{RC}$ is repeated and the cutoff characteristics are improved.

The inductor 92 of the above-described embodiment can be substituted by a resistance element. The resistance element has a function of cutting the high-frequency component of the current by the resistance component. The resistance element may be either a chip resistor or a resistor having a pattern line. The resistance value of the resistance element is preferably a characteristic impedance or more of the signal line from the magnetoresistance effect element. For example, when the characteristic impedance of the signal line is 50Ω and the resistance value of the resistance element is 50Ω, high-frequency power of 45% can be cut by the resistance element. Further, when the characteristic impedance of the signal line is 50Ω and the resistance value of the resistance element is 500Ω, the high-frequency power of 90% can be cut by the resistance element. Also in this case, the output signal output from the magnetoresistance effect element can efficiently flow to the second port 2.

Further, in the above-described embodiment, when the power supply 90 connected to the DC application terminal 4 has a function of cutting the high-frequency component of the current and passing an invariant component of the current, the inductor 92 may be removed. Also in this case, the output signal output from the magnetoresistance effect element can efficiently flow to the second port 2.

Further, in the above-described embodiment, an example in which the frequency setting mechanism 80 is used as the magnetic field application mechanism has been basically described, but the following other examples can be also used as the frequency setting mechanism 80. For example, an electric field application mechanism that applies an electric field to the magnetoresistance effect element may be used as the frequency setting mechanism. When the electric field applied to the magnetization free layer of the magnetoresistance effect element is changed by the electric field application mechanism, the anisotropic magnetic field in the magnetization free layer changes and the effective magnetic field in the magnetization free layer changes. Then, the ferromagnetic resonance frequency of the magnetization free layer is set.

Further, for example, a combination of a piezoelectric body and an electric field application mechanism may be used as the frequency setting mechanism. The piezoelectric body is provided in the vicinity of the magnetization free layer of the magnetoresistance effect element and an electric field is applied to the piezoelectric body. The piezoelectric body to which the electric field is applied is deformed so that the magnetization free layer is distorted. When the magnetization free layer is distorted, the anisotropic magnetic field in the magnetization free layer changes and the effective magnetic field in the magnetization free layer changes. Then, the ferromagnetic resonance frequency of the magnetization free layer is set.

Further, for example, a control film which is an antiferromagnetic or ferromagnetic material having an electromagnetic effect, a mechanism which applies a magnetic field to the control film, and a mechanism which applies an electric field to the control film may be used as the frequency setting mechanism. An electric field and a magnetic field are applied to a control film provided to be magnetically coupled to the magnetization free layer. When at least one of the electric field and the magnetic field applied to the control film is changed, the exchange coupling magnetic field of the magnetization free layer changes and the effective magnetic field of the magnetization free layer changes. Then, the ferromagnetic resonance frequency of the magnetization free layer is set.

Further, when the ferromagnetic resonance frequency of the magnetization free layer of the magnetoresistance effect element is a desired frequency even when the frequency setting mechanism 80 is not provided (a static magnetic field is not applied from the magnetic field application mechanism), the frequency setting mechanism 80 may not be provided.

<Other Applications>

Further, a case has been exemplified in which the magnetoresistance effect device is used as the high-frequency filter in the description above, but the magnetoresistance effect device can be also used as a high-frequency device such as an amplifier.

Further, when the magnetoresistance effect device is used as an amplifier, the DC current or the DC voltage applied from the power supply 90 is set to a predetermined value or more. With such a configuration, a signal output from the second port 2 becomes larger than a signal input from the first port 1, thereby functioning as an amplifier.

As described above, the magnetoresistance effect device can function as a high-frequency device such as an amplifier.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A magnetoresistance effect device comprising:
a first port:
a second port;
a first circuit unit and a second circuit unit which are connected in series between the first port and the second port;
a shared reference electric potential terminal which is connected to both of the first circuit unit and the second circuit unit, or a first reference electric potential terminal and a second reference electric potential terminal, each of which is connected to the first circuit unit and the second circuit unit, respectively; and
a shared DC application terminal configured to be capable of connecting a power supply for applying a DC current or a DC voltage to both of a first magnetoresistance effect element of the first circuit unit and a second magnetoresistance effect element of the second circuit unit, or a first DC application terminal and a second DC application terminal, each of which is configured to be capable of connecting a power supply for applying a DC current or a DC voltage to the first magnetoresistance effect element of the first circuit unit and the second magnetoresistance effect element of the second circuit unit, respectively,
wherein the first magnetoresistance effect element includes a magnetization fixed layer, a magnetization free layer, and a spacer layer interposed therebetween,
wherein a first conductor of the first circuit unit is connected to one end of the first magnetoresistance effect element,
wherein the first conductor has a configuration in which a first end portion of the first conductor is connected to a high-frequency current input side and a second end portion of the first conductor is connected to the shared reference electric potential terminal or the first reference electric potential terminal so that a high-frequency current flows to branch to the first magnetoresistance effect element and the shared reference electric potential terminal or the first reference electric potential terminal,
wherein the second magnetoresistance effect element includes a magnetization fixed layer, a magnetization free layer, and a spacer layer interposed therebetween,
wherein a second conductor of the second circuit unit is connected to one end of the second magnetoresistance effect element, and
wherein the second conductor has a configuration in which a first end portion of the second conductor is connected to a second high-frequency current input side and a second end portion of the second conductor is connected to the shared reference electric potential terminal or the second reference electric potential terminal so that a high-frequency current flows to branch to the second magnetoresistance effect element and the shared reference electric potential terminal or the second reference electric potential terminal.

2. The magnetoresistance effect device according to claim 1,
wherein the second conductor and a facing electrode connected to an end portion facing the first conductor of the first magnetoresistance effect element are formed as a metal layer integrally.

3. A magnetoresistance effect module comprising:
the magnetoresistance effect device according to claim 2; and
a shared DC current source or a shared DC voltage source which is connected to the shared DC application terminal of the magnetoresistance effect device, or a first DC current source or a first DC voltage source and a second DC current source or a second DC voltage source, each of which is connected to the first DC application terminal and the second DC application terminal of the magnetoresistance effect device, respectively.

4. The magnetoresistance effect device according to claim 1,
wherein the first magnetoresistance effect element and the second magnetoresistance effect element are in a series connection relationship with reference to the shared DC application terminal.

5. A magnetoresistance effect module comprising:
the magnetoresistance effect device according to claim 4; and
a shared DC current source or a shared DC voltage source which is connected to the shared DC application terminal of the magnetoresistance effect device, or a first DC current source or a first DC voltage source and a second DC current source or a second DC voltage source, each of which is connected to the first DC application terminal and the second DC application terminal of the magnetoresistance effect device, respectively.

6. The magnetoresistance effect device according to claim 1,
wherein the first magnetoresistance effect element and the second magnetoresistance effect element are in a parallel connection relationship with reference to the shared DC application terminal.

7. A magnetoresistance effect module comprising:
the magnetoresistance effect device according to claim 6; and
a shared DC current source or a shared DC voltage source which is connected to the shared DC application terminal of the magnetoresistance effect device, or a first DC current source or a first DC voltage source and a second DC current source or a second DC voltage source, each of which is connected to the first DC application terminal and the second DC application terminal of the magnetoresistance effect device, respectively.

8. A magnetoresistance effect module comprising:
the magnetoresistance effect device according to claim 1; and
a shared DC current source or a shared DC voltage source which is connected to the shared DC application terminal of the magnetoresistance effect device, or a first DC current source or a first DC voltage source and a second DC current source or a second DC voltage source, each of which is connected to the first DC application terminal and the second DC application terminal of the magnetoresistance effect device, respectively.

* * * * *